United States Patent [19]

Giamei et al.

[11] 4,033,792

[45] July 5, 1977

[54] COMPOSITE SINGLE CRYSTAL ARTICLE

[75] Inventors: Anthony F. Giamei, Middletown; Bernard H. Kear, Madison, both of Conn.

[73] Assignee: United Technologies Corporation, Hartford, Conn.

[22] Filed: Apr. 7, 1976

[21] Appl. No.: 674,694

Related U.S. Application Data

[62] Division of Ser. No. 536,043, Dec. 23, 1974, Pat. No. 3,967,355.

[52] U.S. Cl. .................... 148/32; 428/615; 156/600
[51] Int. Cl.² ........................................ B23K 28/00
[58] Field of Search ............... 29/194, 191; 148/32

[56] References Cited

UNITED STATES PATENTS

| 3,494,709 | 2/1970 | Piearcey | 75/171 X |
| 3,826,700 | 7/1974 | Chu | 148/177 |

*Primary Examiner*—L. Dewayne Rutledge
*Assistant Examiner*—E. L. Weise
*Attorney, Agent, or Firm*—Charles E. Sohl

[57] ABSTRACT

This invention concerns composite articles, particularly those which contain single crystal components. A method is disclosed for joining single crystals together so that the resultant article is free from high angle grain boundaries and therefore possesses exceptional mechanical properties.

3 Claims, 5 Drawing Figures

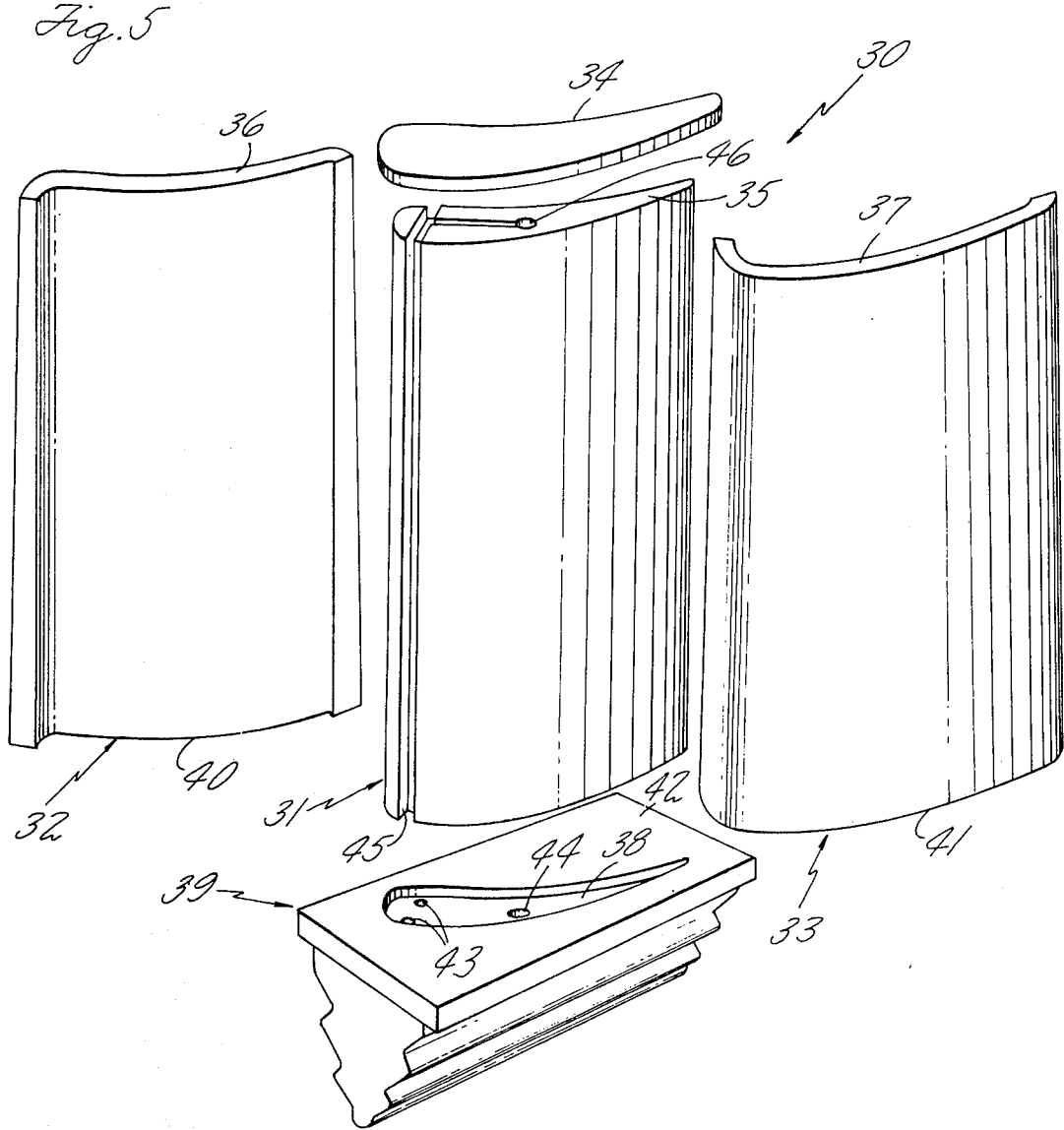

COMPOSITE SINGLE CRYSTAL ARTICLE

This is a division of application Ser. No. 536,043, filed Dec. 23, 1974, now U.S. Pat. No. 3,967,355 dated July 6, 1976.

BACKGROUND OF THE INVENTION

This invention deals with the subject of composite articles, including composite single crystals, and methods for producing the same. A brief description of grain boundaries will be helpful in appreciating the benefits obtained by the use of single crystals. A grain boundary is a region separating two grains of different crystallographic orientation. Differences of opinion exist in the metallurgical field regarding models for grain boundary structure and methods for interpreting grain boundary effects. One way of classifying grain boundaries is in terms of the difference in orientation between the grains. Low angle boundaries, those which separate grains of only slightly different orientation, may be analyzed as arrays of dislocations. Equations and models developed using this assumption have given results which agree well with experimental evidence. The amount of misorientation necessary for a boundary to be classified as high angle is not well established but is usually considered to be greater than about 5°. Wholly satisfactory models have not been developed for high angle grain boundaries. On the basis of experimental evidence it is known that high angle boundaries have much greater mobility than low angle boundaries, and that in general, the mobility of grain boundaries increases as the angle separating the adjacent grains increases. Low angle boundaries are commonly referred to as sub-boundaries and in the remainder of this application the term grain boundary will mean high angle grain boundary unless otherwise indicated. As the angle between the adjacent grains increases the boundary region becomes increasingly disordered. Impurity atoms within the material will in general have different size and electronic properties than the base material. These impurity atoms will be attracted to and will fit better in the disordered region found in high angle grain boundaries. The concentration of impurity atoms at the grain boundary can be several orders of magnitude greater than the concentration of the same impurity atoms within the crystal itself. When such segregation occurs the properties of the grain boundary begin to assume the properties of the impurity atoms. For example, in nickel base superalloys sulfur is a deleterious impurity which segregates to the grain boundaries. At operating temperatures the sulfur in the grain boundaries degrades their mechanical properties and failure in sulfur bearing nickel base superalloys will generally occur by grain boundary failure. Impurity segregation is not a particular problem with low angle grain boundaries. Accordingly, low angle boundaries do not present the same problems in mechanical behavior as do high angle grain boundaries. Grain boundaries are also observed to have deleterious effects during high temperature oxidation and corrosion.

Attempts have been made to reduce these problems through the use of such techniques as directional solidification, described in U.S. Pat. No. 3,260,505, assigned to the assignee of the present application, which minimizes transverse grain boundaries, and through the use of single crystals, as described in U.S. Pat. No. 3,494,709, assigned to the asignee of the present application, to form complete small turbine parts such as blades and vanes. The results obtained from the directional solidification process have been highly satisfactory but to date the incremental improvements obtained through the use of single crystal techniques have not been attractive in view of the added costs.

Another technique which has composition interest in the field of high temperature alloys is the technique of growing crystals having an oriented microstructure or second phase. See for example, U.S. Pat. Nos. 3,793,010 and 3,528,808, both of which are assigned to the assignee of the present application. The conditions required to grow an oriented second phase structure include rigid controls on compositon and it has been found that most alloys having the correct composition, for optimum mechanical properties, do not in general have adequate high temperature oxidation and corrosion resistance for demanding applications such as gas turbine engines.

SUMMARY OF THE INVENTION

In the discussion which follows, reference will be made to single crystals. This term is intended to mean crystalline materials free from high angle grain boundaries. The term "single crystal" is intended to encompass materials which contain non-mobile low angle grain boundaries and dislocation arrays. Also covered by this term, as used in this application, are materials having a regular crystalline matrix which contains a dispersed second phase which may be coherent or non-coherent with the matrix phase. Examples of such materials are nickel base superalloys which contain a coherent dispersion of gamma prime particles in a gamma matrix, and eutectic materials.

The present invention describes composite articles and composite single crystals and methods for producing single crystals which are characterized by having a crystalline structure free from grain boundaries. The composite single crystals of the present invention may have different chemical and or physical properties in different regions of the crystal. For example, through the use of the method of the present invention it is possible to produce a single crystal having a core component with highly desirable mechanical properties and a surface component with extreme oxidation and corrosion resistance. Since the composite crystals of the present invention contain no grain boundaries there will be substantially no possibility of impurity segregation or grain boundary slip. One or more of the components of the composite single crystal may contain an oriented microstructure or second phase for improved mechanical properties.

The concepts disclosed in the present application are broadly applicable to all materials, however, these concepts are particularly useful when applied to metallic materials intended for use at elevated temperatures. Typical of such metals are the nickel and cobalt base superalloys which possess uniquely high strengths and oxidation and corrosion resistance under demanding conditions encountered in gas turbine engines.

The present invention includes descriptions of the relationship which the components must have if grain boundaries are to be avoided and descriptions of the various processes which may be used to join the components together.

The foregoing, and other objects, features and advantages of the present invention will become more apparent in the light of the following detailed description of the preferred embodiment thereof as shown in the accompanying drawing.

BRIEF DESCRIPTION OF THE DRAWING

FIG. 5 shows a possible arrangement of elements to produce a single crystal airfoil.

DESCRIPTION OF THE PREFERRED EMBODIMENT

The preferred embodiment relates to articles formed from at least two single crystal components bonded together under conditions which ensure the absence of grain boundaries. These conditions, which will be discussed below, include crystal orientation, lattice parameters and bonding techniques. The present invention discloses a method for the formation of single crystal articles, free from grain boundaries, with unique and valuable combinations of properties. For example, in one embodiment, single crystal articles may be formed having a core component with high strength but less than optimum oxidation and corrosion resistance and a surface component having lower strength but exceptional oxidation and corrosion resistance. other polycrystalline elements may be included in the article.

It has been found that under certain specific conditions, two single crystals may be joined together to form one single crystal characterized by having essentially only one internal crystal lattice and having no internal grain boundaries. The conditions under which such a composite single crystal may be formed are set forth below. In the following discussion, crystal components of cubic symmetry are assumed, however, it will be appreciated that crystals of other symmetry types such as hexagonal and orthorhombic may be employed.

Figure 1:
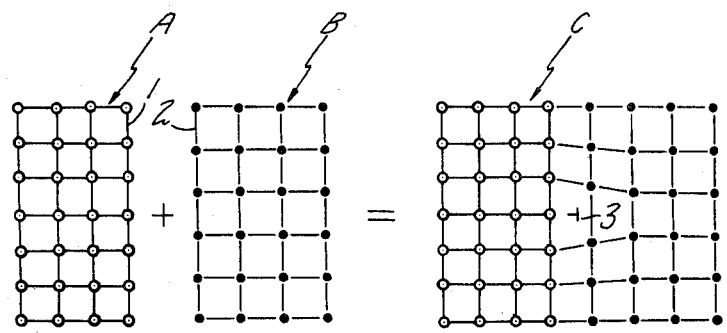
FIG. 1 shows, in schematic form, the lattice structure of two single crystal components before and after bonding.

The first condition which must be satisfied relates to lattice type and parameter. The crystals to be joined must have the same type of crystal structure and substantially equal lattice parameters. It has been found that in order to obtain satisfactory results the difference in lattice parameter between the components must be less than about 5% and preferably less than about 3%. FIG. 1 shows two crystal components, A and B, with adjacent surfaces 1 and 2 respectively, before and after joining to form a composite single crystal C. Components A and B have different lattice parameters, so that component A has seven horizontal atomic planes while crystal B has only six horizontal atomic planes. After joining the two components will have a continuous lattice structure with one internal edge dislocation, 3, which results from the extra plane in component A. Aside from this dislocation, all atoms on the adjacent surfaces 1 and 2 have formed bonds with atoms in the other component. The result of the difference in lattice parameters is the formation of a dislocation structure made up of edge dislocations located at the interface between the two components. A 5% difference in lattice parameters will result in the formation of one edge dislocation for every 20 atomic planes. A dislocation array of this type and density does not have the mobility and deleterious effect on properties of a high angle grain boundary. A surprising feature of the present invention is that the atomic species which make up the single crystal components need not be identical so long as the crystal structure is identical. For example, it is entirely possible to produce a single crystal from two components, one a nickel base alloy and the other a cobalt base alloy, as long as the difference in lattice parameter is within the limits set forth above, and both alloys have the same crystal structure (at least in the plane of the joint). If crystals having different composition are joined, care must be taken to avoid combinations of elements which will form deleterious intermetallic compounds in use. Phase diagrams should be consulted; complete solid solubility is desirable.

Figure 2:
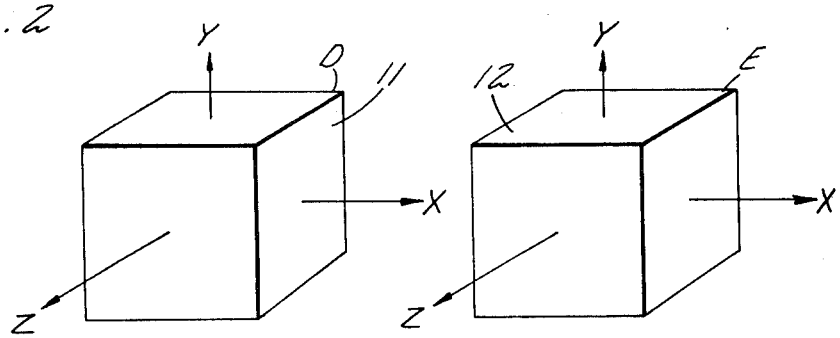
FIG. 2 shows a diagram which relates to the relative orientation of two single crystal elements prior to bonding.
Figure 3:
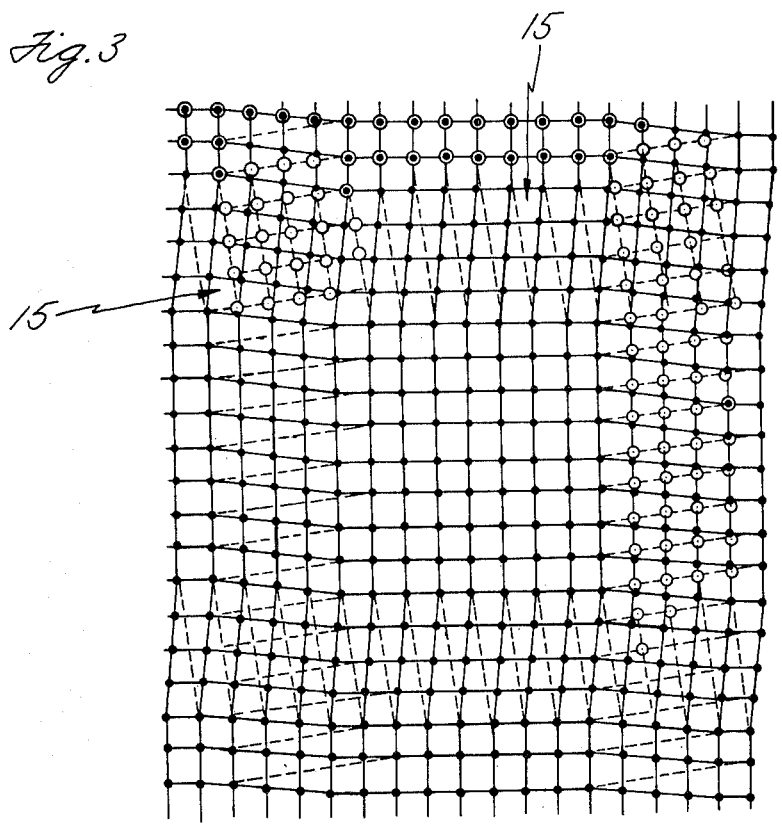
FIG. 3 shows, in schematic form, one form of dislocation structure which may result when slightly misoriented single crystals are bonded together.

The second condition which must be satisfied, if a grain boundary free composite is to result, relates to orientation between the single crystals to be joined. The two single crystal components must have substantially equivalent orientations. FIG. 2 shows two single crystal components D and E oriented prior to joining adjacent faces 11 and 12 together. The orientation of a single crystal component may be described relative to another single crystal component in terms of rotations about three mutually perpendicular axes, X, Y, Z in FIG. 2. In FIG. 2 the X axis is perpendicular to the plane in which the components will be joined while axes Y and Z lie parallel to the plane of the bond. If one crystal is rotated relative to the other about an axis which is perpendicular to the plane of the bond, the bond will contain a network of screw dislocations shown in FIG. 3. FIG. 3 is a schematic of the atomic dislocation arrangement in the plane of the bond showing a plurality of screw dislocations 15 in a regular square array. The solid circles represent the atoms of one component and the open circles represent the atoms of the other component.

Figure 4:
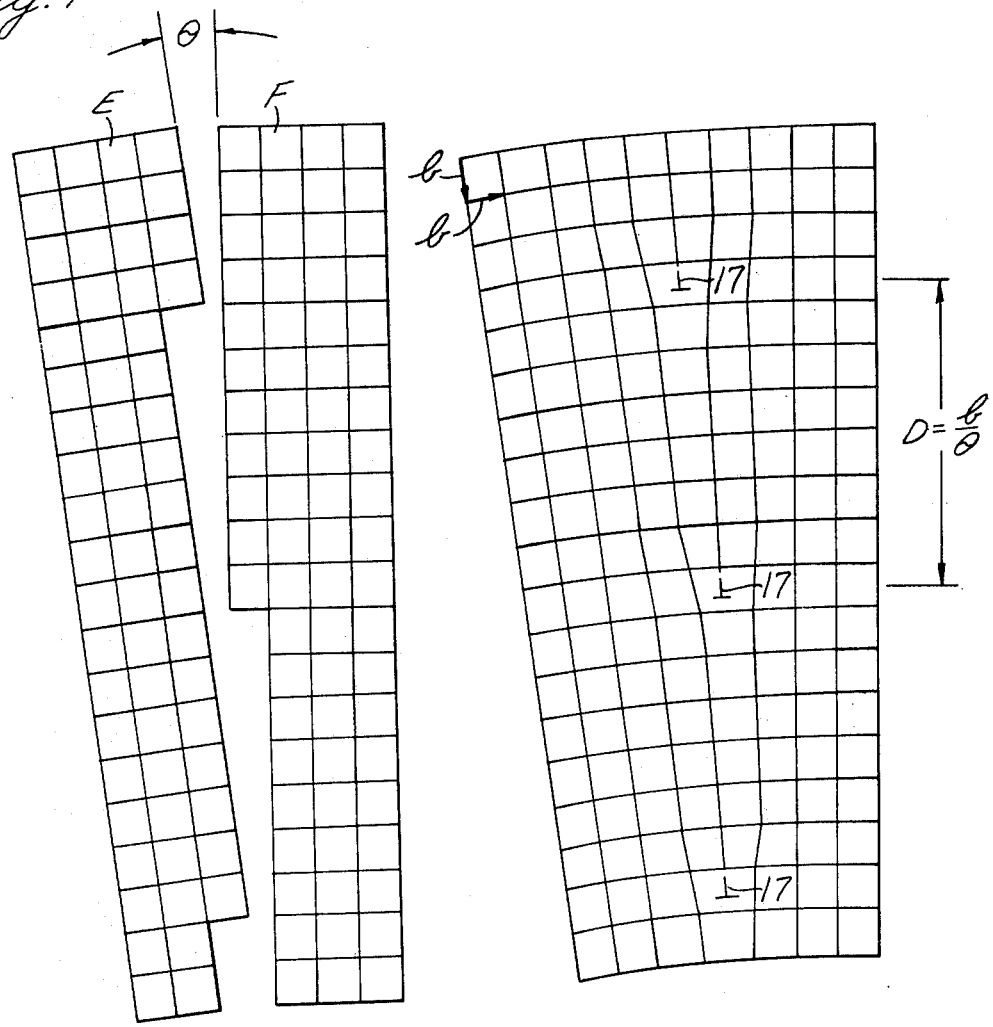
FIG. 4 shows, in schematic form, another form of dislocation structure which may result when slightly misoriented single crystals are bonded together.

If one element is rotated relative to the other about an axis which lies in the plane of the bond a network of edge dislocations 17 will result as shown in FIG. 4. FIG. 4 shows a view perpendicular to the plane of the bond. (Note that the edge dislocations in FIG. 4 differ in orientation by 90° from the edge dislocations shown in FIG. 1 which result from lattice parameter differences). In FIG. 4, it can be seen that the spacing between the edge dislocations is directly related to the angle of mismatch. The distance between the edge dslocations can be described by the following equation:

$$D = b/\theta$$

where $D$ is the distance between the dislocation, $b$ is the interatomic plane spacing and $\theta$ is the angle of mismatch between the adjacent crystals.

A 3° angle of mismatch will result in a spacing of about 20 atomic planes between the adjacent edge dislocations.

In actual practice the crystals will be misoriented in a fashion which can be described in terms of rotation about all three axes and the resultant dislocation structure in the plane of the bond will be a complex mixture of edge and screw dislocations in a regular type of array. For the purposes of this invention, the rotation about any of the three axes must be minimized, but is preferably less than 5° and most preferably less than 3° and the sum of these rotations must be less than 10° and preferably less than 5°. Crystal orientations may be determined using well known X ray techniques.

When the dislocation density at the boundary between the crystal components becomes excessive, the boundary will change from low to high angle and a mobile type of grain boundary will result with deleterious effects. When such a high angle mobile boundary is present the composite no longer can be said to be a single crystal and the benefits of a single crystal structure are lost.

The difference in lattice parameter results in a regular dislocation array with a low dislocation density and the three types of misalignment also result in dislocation arrays, therefore it is effectively the sum of these factors which will determine whether the dislocation density is great enough to produce a mobile type boundary. For purposes of this invention it is believed that the sum of the numerical value of lattice parameter differences (in percent) and the sum of the three numerical values of misalignment (in degrees) should be less than 12 and preferably less than 7 if optimum and reproduceible results are to be achieved. However, it must be recognized that the mobility of the boundary depends upon the interactions between the dislocations which form the boundary. This factor is not easily evaluated. Accordingly the production of composite single crystals using components with high degrees of misorientation and differences in lattice parameters must be approached with care. The relative effect of the lattice parameter differences and misalignment differences on boundary mobility is not accurately known. It is not intended that this invention be limited by the previously set forth numerical limits which are presented for guidance only.

Techniques exist to circumvent the limitations previously set forth regarding lattice parameter and crystallographic orientation. For example, if one wished to join two crystal elements which were misoriented by an 8° rotation about a particular axis, an intermediate layer having a rotation of 4° relative to each of the other components could be employed. An analogous method could be used for crystal components having lattice parameters which differ by excessive amounts.

Assuming that two single crystal components having the required lattice parameter and orientation relationships have been prepared, it is necessary to perform a bonding operation so as to produce the desired final composite single crystal. In order to form a satisfactory bond it is necessary that the surfaces of adjoining crystals be brought into intimate contact under conditions that permit the establishment of metallic bonds between surface atoms on the adjoining surfaces. A small amount of diffusion must occur for the slight atomic rearrangement necessary to form metallic bonds. Several satisfactory methods exist to produce such a joint. Fundamental to all such processes is a requirement of surface cleanliness. The surfaces to be joined must be clean, particularly of reactive impurities. Intimate contact may be aided by the application of heat and pressure to the adjoining crystals. Pressure helps to assure intimate contact by slightly deforming projecting portions of the adjoining crystals so as to increase the surface area of the crystals which is in contact. The application of heat during the bonding process will help establish metallic bonds by increasing the amplitude of the atomic vibrations thus permitting surface atoms on one crystal to bond with surface atoms on the adjoining crystal which are not quite in the proper orientation. The temperature at which the bonding process is performed is limited by microstructural considerations such as incipient melting and dissolution of desirable phases. A proper combination of heat and pressure must be used so as to avoid any possibility of recrystallication occurring from excessive deformation during the bonding process. Such diffusion bonding processes are well known in the art, see for example U.S. Pat. No. 3,530,568 which is assigned to the present assignee.

The bonding process may also be carried out according to the process described in U.S. Pat. No. 3,678,570 which is assigned to the present assignee and in fact this process is preferred. This patent discloses a process known as TLP diffusion bonding process. In the TLP process an intermediate layer having a melting point below the melting point of the components to be joined is placed between the adjacent components to be bonded. The composition of the intermediate layer is similar to the composition of the components to be joined except for the presence of a melting point depressant such as boron. The components and the intermediate material are then held together and heated to a temperature above the melting point of the intermediate material but safely below the melting point of single crystal components. The intermediate material melts and then diffuses into the adjoining elements until the concentration of the melting point depressant is reduced to the point where solidification occurs. Solidification occurs isothermally. At this point a solid bond exists between the adjacent components. A unique characteristic of this process is that a separate crystal structure does not form in the bond area, but the crystal structures of the components being joined extends into the bond area. The presence of a liquid phase assures intimate contact and a good bond results.

Some other embodiments of the present invention will be made clear with reference to FIG. 5. FIG. 5 shows a schematic exploded view of a turbine blade 30, having an airfoil shape, made according to the present invention. The blade consists of a core element 31 made from a material chosen for strength at elevated temperatures. As will be apparent in later discussion the material from which the core element 31 is fabricated need not possess exceptional corrosion or oxidation resistance since it will be protected in service. The core element 31 contains passage 45 and 46 for the flow of a fluid such as air, for cooling. Two face elements 32 and 33 are bonded to the core element 31 according to the teaching of the present invention. The orientation of the face elements 32 and 33 are selected to be identical to the orientation of the core element 31, at least within the limits set forth previously in this application. The contents of U.S. Pat. No. 3,494,709, assigned to the assignee of the present invention are incorporated into the present application; this patent discloses preferred orientation for single crystal turbine blades. The face elements 32 and 33 may be of uniform cross section or may be tapered as shown so as to produce an optimum air foil shape. A cap element 34 protects the end of the core element from oxidation and corrosion. The cap element is oriented according to the invention and bonded to the top surface 35 of a core element 31 and to the top surface 36 and 37 of the elements 32 and 33. The core element 31 is inserted into a recess 38 in a base member 39 having the proper lattice prameter and orientation and bonded thereto.

The bottom surfaces 40 and 41 of the face elements 32 and 33 are bonded to the top surface 42 of the base element 39. The base element 39 also contains connecting passages 43 and 44 to introduce cooling air into the cooling passages 45 and 46 in the core element 31.

A particular advantage of the blade form set forth in FIG. 5 is that all of the elements from which the blade is constructed may have a uniform cross section and therefore may be fabricated as single crystals directly from molten material using any one of several well known processes. See for example "The Art and Science of Growing Crystals" by J. J. Gilman, N.Y. 1963, especially pp 275-365. Through the use of constant cross section crystals, incorporating cooling passages, the need for intricate cores of small section may be eliminated. These fragile cores have been a source of difficulties in prior processes since they tend to break due to thermal stresses and to sag and distort at elevated temperature. As previously set forth the core element 31 is selected for high temperature strength while the surface elements 32 and 33 are selected for oxidation and corrosion resistance as is the cap element 34. The base element 39 material is selected for strength at slightly lower temperatures and for notch toughness. If all of the elements have the same crystallographic orientation, lattice parameters and crystal structure as previously described, when properly assembled the entire composite component will have a structure entirely free from deleterious high angle grain boundaries.

It is a particular advantage of the present invention that single crystal elements with a constant cross section may be combined into a composite article with a nonuniform cross sectional shape. Thus machining and other processing may be minimized assuming a satisfactory process to grow single crystals of constant cross section. The blade of FIG. 5 would only require machining to form the connecting cooling passage across the top of the core element.

While the preceding discussion of FIG. 5 has been based on the assumption that all of the components which make up the turbine blade of FIG. 5 are single crystals, it will be appreciated that one or more polycrystalline elements may be incorporated in such a structure. For example the base element 39 may be fabricated from a polycrystalline material since operating temperatures at the base of the blade are significantly below temperatures incurred by the rest of the blade. Another possibility for a polycrystalline component in such a structure is the core element 31. This core element 31 may be fabricated from a polycrystalline material having an oriented second phase. Examples of such material include those known as directionally solidified eutectics as disclosed in U.S. Pat. Nos. 3,124,452 and 3,554,817 which are assigned to the assignee of the present application. The advantages of such a two phase structure are anisotropy and extreme strength which derives from the oriented nature of the second phase. A general drawback of such materials is that the compositions which yield maximum mechanical properties do not in general possess adequate oxidation and corrosion resistance at the elevated temperatures encountered in gas turbine applications. One embodiment of the present invention may be utilized in the fabrication of a single crystal sheath which would protect such a high strength material from deleterious oxidation and corrosion effects.

Yet another possible alternative for the structure shown in FIG. 5 is the inclusion of ceramic materials, for one or more of the elements, as the core element 31. In U.S. Pat. Nos. 3,844,727 and 3,844,782 there is described a metal-ceramic composite material consisting of a ceramic body having an elongated shape with a plurality of single crystal rods passing through the ceramic element bonded to metallic end pieces. Ceramic materials are noted for their compressive strengths, but are usually weak in tension and a particular feature of these patents is that the ceramic material is prestressed in compression so as to give improved tensile properties and resistance to cracking. Such a structure combines some of the beneficial properties of metallic materials and ceramic materials, however, certain detrimental properties of ceramic such as brittleness and susceptibility to thermal shock still remain a problem. If such a structure were to be incorporated as the core element 31 the single crystal face elements 32 and 33 shown in FIG. 5 would protect the ceramic material from deleterious thermal shock and possible damage from mechanical impacts.

Having thus described a typical embodiment of our invention, that which we claim as new and desire to secure by Letters Patent of the United States is:

1. A metallic composite blade for use in gas turbine engines, for applications where at least a portion of the blade is exposed to a corrosive environment, including
   a. a high strength single crystal core element
   b. at least one oxidation resistant single crystal element bonded to the core element so as to protect the core from the corrosive environment
   c. a base element bonded to the core element
   wherein the following relationship is maintained between all bonded adjacent single crystal elements
      a. the crystal structure types are substantially identical
      b. the lattice parameters are substantially identical
      c. the orientations are substantially identical so that there are no mobile high angle grain boundaries between the bonded single crystal elements.

2. A blade as in claim 1 wherein the base element is a single crystal.

3. A metallic composite blade for use in gas turbine engines including
   a. a core element of eutectic composition having an oriented microstructure
   b. a base element bonded to the core element
   c. a protective single crystal sheath, formed from a plurality of single crystals, bonded to the core element with the single crystals being bonded to each other and having the following relationship
      a. the crystal structure types are substantially identical
      b. the lattice parameters are substantially identical
      c. the crystal orientations are substantially identical whereby there are no mobile high angle grain boundaries between the bonded single crystals.

* * * * *

UNITED STATES PATENT OFFICE
CERTIFICATE OF CORRECTION

PATENT NO. : 4,033,792
DATED : July 5, 1977
INVENTOR(S) : ANTHONY F. GIAMEI and BERNARD H. KEAR It is certified that error appears in the above-identified patent and that said Letters Patent are hereby corrected as shown below:

Column 2, line 7        "composition" should read -- aroused --

Column 3, line 62      After "extra" insert -- atomic --

Column 4, line 51      "dslocations" should read -- dislocations --

Column 5, line 24      "reproduceible" should read -- reproducible --

Signed and Sealed this

Eighteenth Day of July 1978

[SEAL]

Attest:

RUTH C. MASON
Attesting Officer

DONALD W. BANNER
Commissioner of Patents and Trademarks